(12) United States Patent
Hillman, Jr. et al.

(10) Patent No.: US 7,765,086 B2
(45) Date of Patent: Jul. 27, 2010

(54) MODULATION DOMAIN TRIGGER

(75) Inventors: Alfred K. Hillman, Jr., Banks, OR (US); Marcus K. Dasilva, Portland, OR (US); Edward C. Gee, Portland, OR (US); Yi He, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 72 days.

(21) Appl. No.: 11/009,161

(22) Filed: Dec. 9, 2004

(65) Prior Publication Data

US 2006/0129355 A1 Jun. 15, 2006

(51) Int. Cl.
*G06F 11/30* (2006.01)
(52) U.S. Cl. .................................................. 702/183
(58) Field of Classification Search ................. 702/183, 702/76, 182, 189, 56; 345/440.1, 440; 600/323; 375/260, 232; 725/67; 607/27, 60; 329/304
See application file for complete search history.

(56) References Cited

U.S. PATENT DOCUMENTS

| | | | | |
|---|---|---|---|---|
| 5,103,402 A | * | 4/1992 | Morton et al. | ................. 702/76 |
| 5,594,490 A | * | 1/1997 | Dawson et al. | ................. 725/67 |
| 5,841,286 A | | 11/1998 | Stoops | |
| 6,484,111 B1 | | 11/2002 | Nara | |
| 6,507,804 B1 | * | 1/2003 | Hala et al. | ................... 702/182 |
| 6,608,863 B1 | * | 8/2003 | Onizawa et al. | ............. 375/232 |
| 6,795,735 B2 | * | 9/2004 | Esler | .............................. 607/27 |
| 6,850,238 B2 | * | 2/2005 | Bryant et al. | ............. 345/440.1 |
| 7,346,114 B2 | * | 3/2008 | Iancu et al. | ................... 375/260 |
| 2001/0023361 A1 | * | 9/2001 | Pauly et al. | .................... 607/60 |
| 2002/0017948 A1 | * | 2/2002 | Hyakudai et al. | ........... 329/304 |
| 2004/0119620 A1 | | 6/2004 | Tran | |
| 2005/0033128 A1 | * | 2/2005 | Ali et al. | ...................... 600/323 |
| 2006/0083321 A1 | * | 4/2006 | Sedarat | ........................ 375/260 |

FOREIGN PATENT DOCUMENTS

EP 0973041 1/2000

OTHER PUBLICATIONS

Marcus Da Silva, Trigger-Capture-Analyze: Three Steps Toward Understanding Today's Complex RF Signals, Microwave Journal, Mar. 2004.
"Next-Generation Devices and Networks Bring Opportunities and Challenges", A. Sivula, Proceedings International Test Conference 2003. (ITC). Charlotte, NC, Sep. 30-Oct. 2, 2003, International Test Conference, New York, NY: IEEE, US, Sep. 30, 2003, p. 1319.
Digital Modulation in Communication Systems—an introduction [Online] May 13, 2002, from internet: http://cp.literature.agilent.com/litweb/pdf/5965-7160E.pdf.

* cited by examiner

*Primary Examiner*—Tung S Lau
*Assistant Examiner*—Xiuquin Sun
(74) *Attorney, Agent, or Firm*—Francis I. Gray; Michael A. Nelson

(57) ABSTRACT

A modulation domain trigger generator demodulates a modulated input signal to extract information content, and a trigger is generated from the extracted information content in response to specified trigger criteria. The modulation domain trigger generator may be combined with a plurality of different types of trigger generators, including frequency domain and time domain trigger generators, to process the input signal in response to different trigger criteria to produce more than one trigger. The different trigger outputs may be combined to produce an acquisition trigger to acquire data surrounding an anomalous or identifiable event within the input signal.

8 Claims, 3 Drawing Sheets

MODULATION DOMAIN TRIGGER

BACKGROUND OF THE INVENTION

The present invention relates to test and measurement instrumentation, and more particularly to triggering of instruments for acquiring and analyzing data in real time.

FIG. 1 shows a basic block diagram of one type of a real-time test and measurement instrument—a real-time spectrum analyzer (RTSA), such as the Tektronix WCA280A, WCA380, RSA2200A and RSA3300A manufactured by Tektronix, Inc. of Beaverton, Oreg. An RF signal is input to an RF signal conditioner and then converted to an intermediate frequency (IF) signal by mixing with a local oscillator frequency. The IF signal is filtered and digitized, and the resulting IF data amplitude and phase are corrected. From the corrected IF signal a set of I (In-phase) and Q (Quadrature-phase) data may be generated for storage in a memory for subsequent processing. The I and Q data also may be input to a trigger generator. In response to specified conditions that define a trigger event, the trigger generator outputs a trigger signal. A memory controller in response to the trigger signal captures the I/Q data in the memory that surrounds the defined trigger event in the RF signal. The defined trigger event may occur in the frequency spectrum being monitored by the spectrum analyzer. The implementation of such a "frequency mask" trigger is disclosed in U.S. Pat. No. 5,103,402. Also conventional time domain triggers may be used that trigger based on the power (or voltage level) of the RF signal being monitored, as in conventional oscilloscopes.

Modern communication systems have become quite complex and include many different modulation systems for placing information on a carrier signal. As a result often a problem is known to exist, but the source of the problem is difficult to pin down. This is especially true when the problem is intermittent. For example in a demodulated bit sequence there may be an occasional wrong bit in the sequence. In order to solve such a problem it is necessary to capture data surrounding the anomalous event. Since the error is in the information or demodulation domain, frequency mask triggering and amplitude triggering are not suitable to find such an information error. Thus long data records, on the order of hours or even days, may have to be examined manually to try to find the data that surrounds such an event. The information may be presented in the form of a constellation display or error vector magnitude display for QAM modulated signals, and then identified from such a display after processing all of the long data records. In other words the communication system knows that there is a problem, but not where or when the problem occurs. Once the problem is located in time and space, then the problem can be solved from an analysis of the data occurring in the region of the problem event.

What is desired is to extend real-time triggering beyond frequency mask triggering and conventional time domain (amplitude) triggering to a method of automatically acquiring data immediately surrounding an anomalous or identifiable event in the information domain of a communication signal.

BRIEF SUMMARY OF THE INVENTION

Accordingly the present invention provides an extension of real-time triggering to the modulation domain to produce a modulation domain trigger. A modulation domain trigger generator converts a modulated input signal to a demodulation signal to extract information content, and a trigger is generated in response to the extracted information content in response to specified trigger criteria. The modulation domain trigger generator may be combined with a plurality of different types of trigger generators, including frequency domain and time domain trigger generators, to process the input signal in response to different trigger criteria to produce more than one trigger. The different trigger outputs may be combined to produce an acquisition trigger to acquire data surrounding an anomalous or identifiable event within the input signal.

The objects, advantages and other novel features of the present invention are apparent from the following detailed description when read in conjunction with the appended claims and attached drawing figures.

BRIEF DESCRIPTION OF THE SEVERAL VIEW OF THE DRAWING

DETAILED DESCRIPTION OF THE INVENTION

Figure 1:
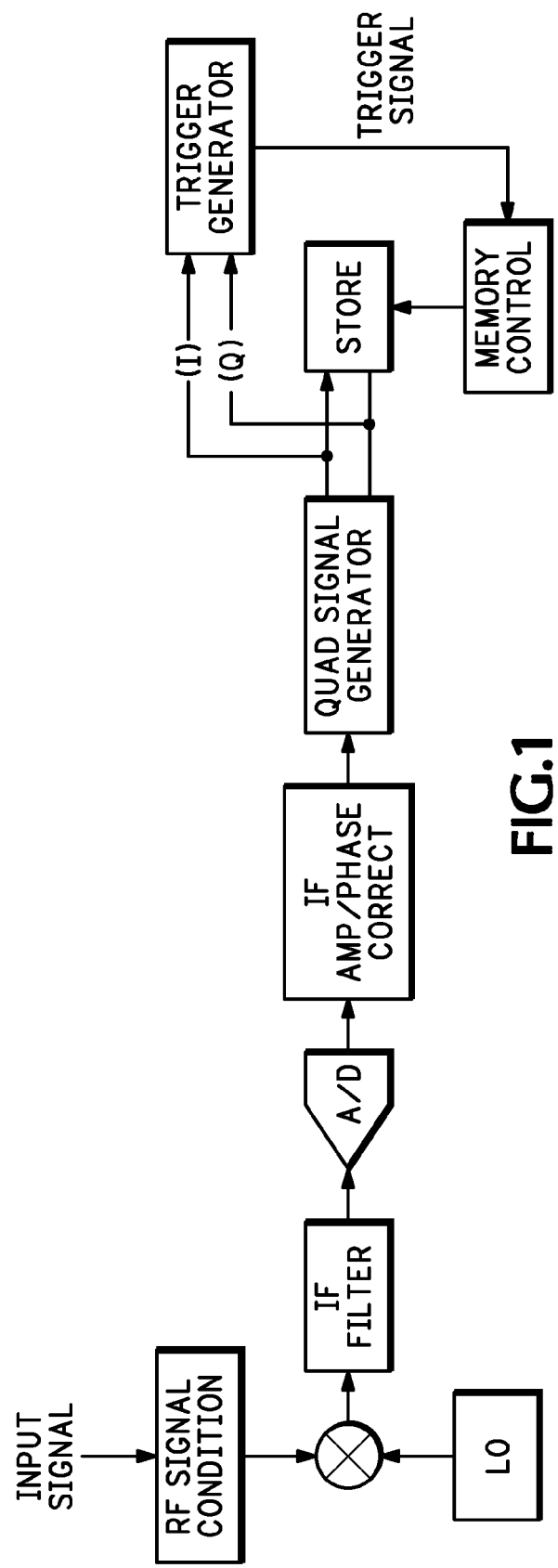
FIG. 1 is a block diagram view of a conventional real-time spectrum analyzer that may use modulation domain triggering according to the present invention.
Figure 2:
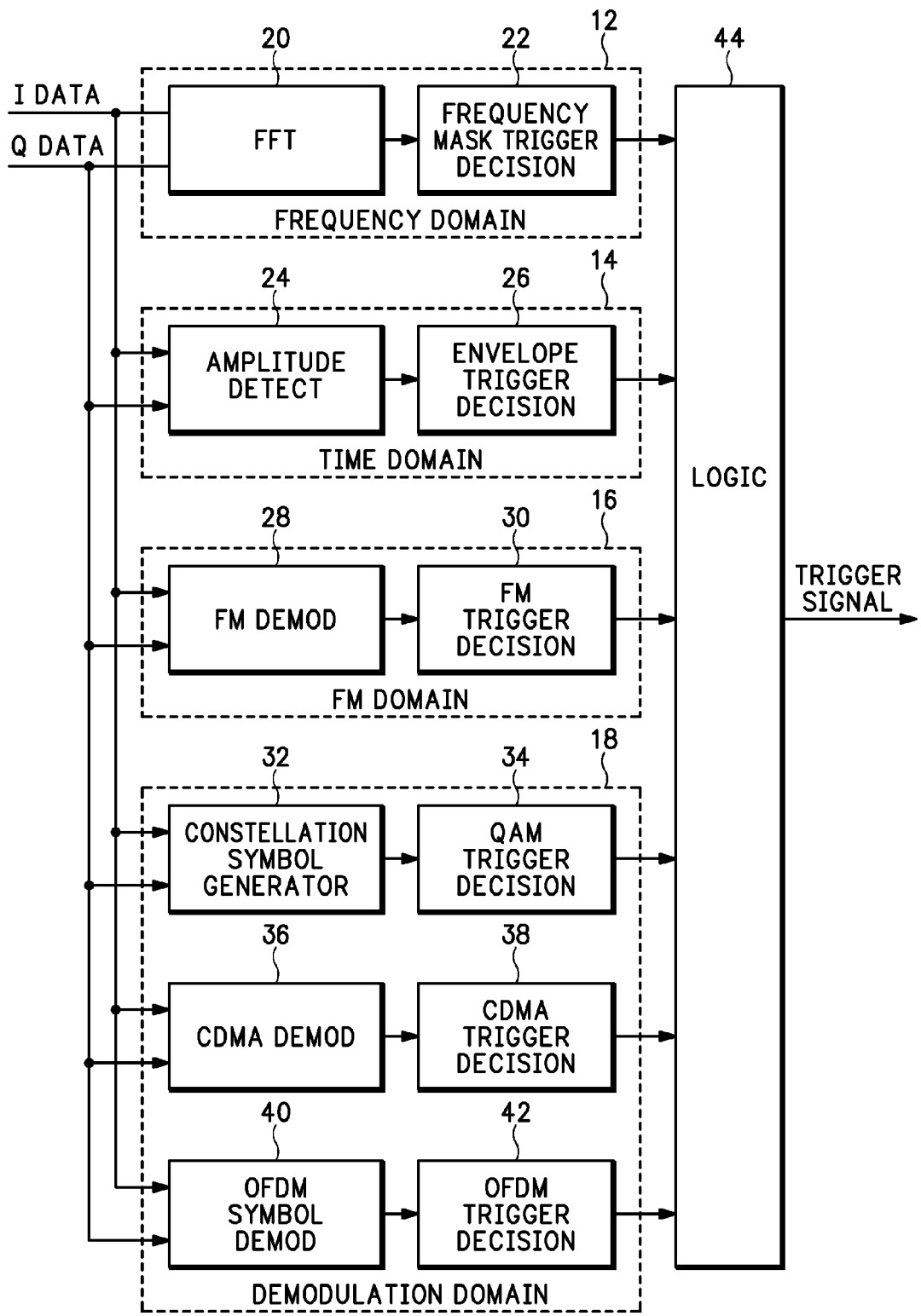
FIG. 2 is a block diagram view of a trigger generator including a modulation domain trigger according to the present invention.

Referring now to FIG. 2 the digitized I and Q data from the receiver section of a real-time test and measurement instrument, such as the RTSA shown in FIG. 1, is input to a plurality of trigger generator functions 12-18 which operate in different domains of the input signal. The first trigger function 12 may be a frequency domain function that includes a fast Fourier transform module 20 to convert the I and Q data to the frequency domain followed by a frequency mask trigger decision module 22 that generates a frequency mask trigger according to frequency profiles or masks provided—see U.S. Pat. No. 5,103,402.

The second trigger function 14 may be a time domain trigger function that includes an amplitude detection module 24 that detects the envelope of the input signal, I and Q data for example, followed by an envelope trigger decision module 26 that generates an amplitude modulation trigger according to various amplitude parameters applied—min, max, peak, rms, average, etc. as may be used in conventional oscilloscopes.

The third trigger function 16 may be a frequency modulation trigger function that includes an FM demodulator module 28 that detects the extent of the FM modulation bandwidth or deviation followed by an FM trigger decision module 30 that generates a frequency modulation trigger when the FM modulation bandwidth or deviation exceeds specified limits, for example.

Figure 3:
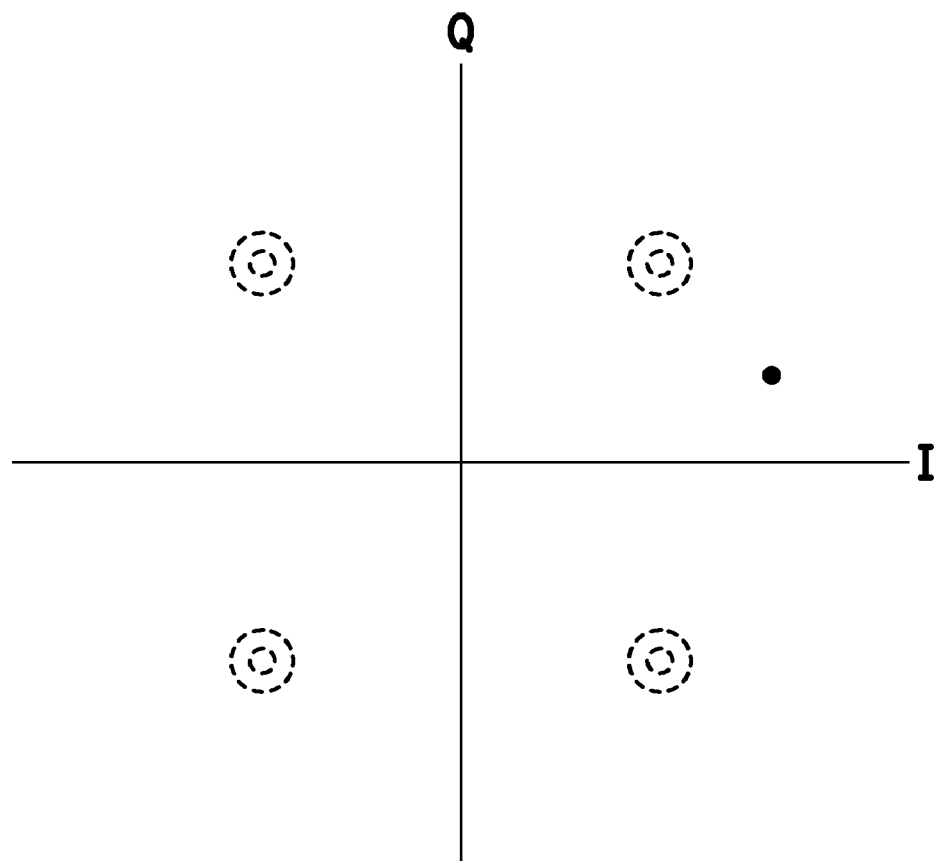
FIG. 3 is a graphic view of a QAM modulation domain trigger criteria according to the present invention.

The fourth trigger function 18 may be an information trigger function that may include several information demodulation functions. For example the I and Q data may be input to a constellation symbol generator module 32 that produces a display such as that shown in FIG. 3. Generally the data points represented by the I,Q data fall onto well-defined point locations in each quadrant of the I,Q display. A QAM (Quadrature Amplitude Modulation) trigger decision module 34 following the constellation symbol generator module 32 may base a trigger decision on whether the I,Q data points are within circular regions in each quadrant, as indicated by the dotted lines, or outside such regions as shown by the one outlier point in FIG. 3.

Another modulation domain trigger generator may include a CDMA (Code Domain Multiple Access) code domain detection module 36 that separates the various channels into a bar graph according to the orthogonal code used and the number of channels used, such as shown in allowed U.S. patent application Ser. No. 09/919,690. The CDMA code domain detection module is followed by a code domain trigger decision module 38 that may provide an expected amplitude level for each sub-code, i.e., pattern of sub-code bars, as an example, to produce a code domain trigger.

A further modulation domain trigger may include an OFDM (Orthogonal Frequency Division Multiplexing) symbol detection module 40 followed by an OFDM trigger decision module 42. Since the OFDM system has multiple sub-carriers surrounding a carrier frequency as well as QAM modulation for each sub-carrier, etc., the OFDM trigger decision module 42 may base a trigger decision on sub-carrier amplitude, modulation or bit content, or any combination thereof.

The above examples of modulation domain triggers are just a few of the possibilities. There are other analog/digital modulation formats besides those mentioned above, such a amplitude shifting keying (ASK), eighth phase shifting keying (8PSK), vestigial sideband (VSB), and the like. The techniques described above apply equally to any present and future modulation formats, even though not mentioned specifically herein.

In any event the outputs from the trigger generators 12-18 are input to a logic circuit 44 for selecting a desired one of the input triggers or a desired combination of the input triggers as an output trigger to the memory controller of FIG. 1 in order to stop further data acquisition and capture the data surrounding the event that caused the trigger condition. Since the processing time required to generate the trigger signal from each of the trigger generators 12-18 is known, as well as the processing time in the logic circuit 44, the point in the data that caused the trigger event may be pin-pointed for examination by a user without having to manually process a long data record.

The triggering system described above may also be applied to already acquired data, either by the same instrument or some other instrument, or to stored or simulated data on a disc in order to locate an anomalous or identifiable event within such data, providing both real-time and post-processing capabilities. Although described with respect to a real-time spectrum analyzer, the described triggering system may be used with other instruments that acquire data in real time, such as oscilloscopes, logic analyzers, network analyzers, etc. in order to trigger on events related to information content of the input signal.

Thus the present invention provides a modulation domain trigger capability to a triggering system in addition to time and frequency domain triggers for both real-time triggering and for analyzing long data records in a post-processing scenario by demodulating the digitized data from a receiver section of an instrument to obtain information content, and processing the information content in a trigger decision module to produce a specific trigger which may be combined with other types of triggers to acquire data specifically to pin-point an anomaly or identifiable event that otherwise would require long periods of manual analysis over long record length data.

What is claimed is:

1. A real-time test and measurement instrument comprising:
  a plurality of trigger generators, each trigger generator providing as an output a different type of trigger signal;
  a logic circuit for selecting a desired one of the outputs of the trigger generators or a desired combination of the outputs from the trigger generators to produce an acquisition trigger signal; and
  a memory for acquiring data containing an anomalous or identifiable event from a modulated input signal in response to the acquisition trigger signal;
  wherein one of the trigger generators is a modulation domain trigger generator comprising:
  a demodulator module for demodulating the modulated input signal according to a specified modulation standard to obtain data representing information content; and
  a trigger decision module for analyzing the information content for an occurrence of the anomalous or identifiable event and generating as an output a modulation domain trigger signal upon the occurrence of the anomalous or identifiable event.

2. The real-time test and measurement instrument as recited in claim 1 wherein the modulated input signal comprises a signal selected from the group consisting of a realtime modulated signal, a stored modulated signal, and a simulated modulated signal.

3. A real-time test and measurement instrument comprising:
  a plurality of trigger generators, each trigger generator providing as an output a different type of trigger signal;
  a logic circuit for selecting a desired one of the outputs of the trigger generators or a desired combination of the outputs from the trigger generators to produce an acquisition trigger signal; and
  a memory for acquiring data containing an anomalous or identifiable event from a modulated input signal in response to the acquisition trigger signal;
  wherein one of the trigger generators is a modulation domain trigger generator comprising:
  a demodulator module for demodulating the modulated input signal according to a specified modulation standard to obtain data representing information content; and
  a trigger decision module for analyzing the information content for an occurrence of the anomalous or identifiable event and generating as an output a modulation domain trigger signal upon the occurrence of the anomalous or identifiable event;
  wherein the specified modulation standard is selected from the group consisting of Quadrature Amplitude Modulation (QAM), Code Division Multiple Access (CDMA), Orthogonal Frequency-Division Multiplexing (OFDM), Amplitude Shifting Keying (ASK), Eighth Phase Shifting Keying (8PSK), and Vestigial Sideband (VSB).

4. A test and measurement instrument comprising:
  a plurality of trigger generators, each trigger generator providing as an output a different type of trigger signal;
  means for selecting a desired one of the outputs of the trigger generators or a desired combination of the outputs from the trigger generators to produce an acquisition trigger signal; and
  means for acquiring data containing an anomalous or identifiable event from a modulated input signal in a memory in response to the acquisition trigger signal;
  wherein one of the trigger generators is a modulation domain trigger generator comprising:
  means for demodulating the modulated input signal according to a specified modulation standard to obtain data representing information content;

means for analyzing the information content for an occurrence of the anomalous or identifiable event; and means for generating as an output a modulation domain trigger signal upon the occurrence of the anomalous or identifiable event.

5. The test and measurement instrument as recited in claim 4 wherein the modulated input signal comprises a signal selected from the group consisting of a realtime modulated signal, a stored modulated signal, and a simulated modulated signal.

6. A test and measurement instrument comprising:

a plurality of trigger generators, each trigger generator providing as an output a different type of trigger signal;

means for selecting a desired one of the outputs of the trigger generators or a desired combination of the outputs from the trigger generators to produce an acquisition trigger signal; and means for acquiring data containing an anomalous or identifiable event from a modulated input signal in a memory in response to the acquisition trigger signal;

wherein one of the trigger generators is a modulation domain trigger generator comprising:

means for demodulating the modulated input signal according to a specified modulation standard to obtain data representing information content;

means for analyzing the information content for an occurrence of the anomalous or identifiable event; and means for generating as an output a modulation domain trigger signal upon the occurrence of the anomalous or identifiable event;

wherein the specified modulation standard is selected from the group consisting of Quadrature Amplitude Modulation (QAM), Code Division Multiple Access (CDMA), Orthogonal Frequency-Division Multiplexing (OFDM), Amplitude Shifting Keying (ASK), Eighth Phase Shifting Keying (8PSK), and Vestigial Sideband (VSB).

7. An apparatus for a real-time test and measurement instrument comprising:

a plurality of trigger generators, each trigger generator providing as an output a different type of trigger signal; and a logic circuit for selecting a desired one of the outputs of the trigger generators or a desired combination of the outputs from the trigger generators to produce an acquisition trigger signal;

wherein one of the trigger generators is a modulation domain trigger generator comprising:

a demodulator module for demodulating a modulated input signal according to a specified modulation standard to obtain data representing information content; and a trigger decision module for analyzing the information content for an occurrence of an anomaly and generating a trigger signal upon the occurrence of the anomaly.

8. An apparatus for a real-time test and measurement instrument comprising:

a plurality of trigger generators, each trigger generator providing as an output a different type of trigger signal; and a logic circuit for selecting a desired one of the outputs of the trigger generators or a desired combination of the outputs from the trigger generators to produce an acquisition trigger signal;

wherein one of the trigger generators is a modulation domain trigger generator comprising:

a demodulator module for demodulating a modulated input signal according to a specified modulation standard to obtain data representing information content; and a trigger decision module for analyzing the information content for an occurrence of an anomaly and generating a trigger signal upon the occurrence of the anomaly;

wherein the specified modulation standard is selected from the group consisting of Quadrature Amplitude Modulation (QAM), Code Division Multiple Access (CDMA), Orthogonal Frequency-Division Multiplexing (OFDM), Amplitude Shifting Keying (ASK), Eighth Phase Shifting Keying (8PSK), and Vestigial Sideband (VSB).

* * * * *